(12) United States Patent
Mai et al.

(10) Patent No.: US 9,372,950 B2
(45) Date of Patent: Jun. 21, 2016

(54) CIRCUIT LAYOUT METHOD AND CIRCUIT LAYOUT APPARATUS

(71) Applicant: Wistron Corporation, New Taipei (TW)

(72) Inventors: Xian-Feng Mai, New Taipei (TW); Zheng-Wei Wu, New Taipei (TW); Hsiao-Ming Wang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 14/484,352

(22) Filed: Sep. 12, 2014

(65) Prior Publication Data

US 2015/0286767 A1    Oct. 8, 2015

(30) Foreign Application Priority Data

Apr. 3, 2014    (CN) .......................... 2014 1 0134573

(51) Int. Cl.
*G06F 17/50*    (2006.01)
(52) U.S. Cl.
CPC ........ *G06F 17/5072* (2013.01); *G06F 17/5081* (2013.01)
(58) Field of Classification Search
CPC ................................................... G06F 17/5072
USPC ......................................................... 716/112
See application file for complete search history.

(56) References Cited

U.S. PATENT DOCUMENTS

2004/0010766 A1 *   1/2004   Swope .............................. 716/15
2011/0130860 A1 *   6/2011   Kelley .......................... 700/121

FOREIGN PATENT DOCUMENTS

CN    103577390 A    2/2014
TW    201351175 A    12/2013

OTHER PUBLICATIONS

Office Action issued in corresponding Taiwan application on Jul. 27, 2015 (and its partial English translation).

* cited by examiner

*Primary Examiner* — Suchin Parihar
(74) *Attorney, Agent, or Firm* — McClure, Qualey & Rodack, LLP

(57) ABSTRACT

A circuit layout method and a circuit layout apparatus are disclosed. The circuit layout apparatus comprises a display apparatus, an input device, a stack up database and a processor. The display apparatus shows a system interface. The input device inputs a user request in response to the system interface. The processor selects a stack up data table, corresponding to the user request, from the stack up database, and generates a design rule of a computer aided design (CAD) according to the stack up data table. The processor checks whether a circuit board design complies with the design rule.

14 Claims, 7 Drawing Sheets

| ☑ | NON-HDI | ☐ | HDI | ☑ | ☐ | COPLANAR | | | preview |
|---|---|---|---|---|---|---|---|---|---|
| ☑ | finished board thickness | 1.0 | mm | | | L | | | |
| ☐ | IMPEDANCE | 0.0.0 | Ω | layer count | 6 | 0+0+0+ ☐ (N+M+N or N+M+N+) | | | |
| | | | | MODEL | | | | | |
| | | L1 | Cu ☐ mil | ●Signal ○G/P | | ☐ reference layer | Ln/Lm | | |
| | | dielectric layer thickness | | | | mil | | | |
| | | L2 | Cu ☐ mil | ○Signal ●G/P | | ☐ reference layer | Ln/Lm | | |
| | | dielectric layer thickness | | | | mil | | | |
| | layer type setting | L3 | Cu ☐ mil | ●Signal ○G/P | | ☐ reference layer | Ln/Lm | | |
| | | dielectric layer thickness | | | | mil | | | |
| | | L4 | Cu ☐ mil | ●Signal ○G/P | | ☐ reference layer | Ln/Lm | | |
| | | dielectric layer thickness | | | | mil | | | |
| | | L5 | Cu ☐ mil | ○Signal ●G/P | | ☐ reference layer | Ln/Lm | | |
| | | dielectric layer thickness | | | | mil | | | |
| | | 6-1.0-1n | | | | | | | |
| | | 6-1.0-2a | | | | | | | |
| | | 6-1.0-3b | | | | | | | |

FIG. 3

| stack up code | 6-1.2-3j(2.54) | precaution | 1.Impedance Control tolerance +/- 10% 2.Please make Coupon and Impedance report according to the specification | | | | |
|---|---|---|---|---|---|---|---|
| finished board thickness(mm) | 1.2=0.12 | | | | | | |
| stack up | | | Spec \ Layer | impedance requirement | | | |
| | | | | L1(Ref. Plane) | L3(Ref. Plane) | L4(Ref. Plane) | L6(Ref. Plane) |
| | mil | | | single-end type (line width: mil) | | | |
| L1 G/P | 1.7 | | 33Ω | 12.0(L2) | 12.5(L2/L5) | 12.5(L2/L5) | 12.0(L5) |
| | PP 3.5 | | 33Ω | 11.0(L2) | 10.5(L2/L5) | 10.5(L2/L5) | 11.0(L5) |
| L2 G/P | 1.2 | | 37.5Ω | 10.0(L2) | 9.5(L2/L5) | 9.5(L2/L5) | 10.0(L5) |
| | Core 4 | | 40Ω | 8.5(L2) | 8.0(L2/L5) | 8.0(L2/L5) | 8.5(L5) |
| L3 Signal | 1.2 | | 45Ω | 7.0(L2) | 6.5(L2/L5) | 6.5(L2/L5) | 7.0(L5) |
| | PP 23 | | | detachable (line width/line spacing/line width: mil) | | | |
| L4 Signal | 1.2 | | 110Ω | 4/12/4(L2) | 3.5/13/3.5(L2/L5) | 3.5/13/3.5(L2/L5) | 4/12/4(L5) |
| | Core 4 | | 100Ω | 3.5/5/3.5(L2) | 3.5/7/3.5(L2/L5) | 3.5/7/3.5(L2/L5) | 3.5/5/3.5(L5) |
| L5 G/P | 1.2 | | 95Ω | 4.5/6/4.5(L2) | 4/6.5/4(L2/L5) | 4/6.5/4(L2/L5) | 4.5/6/4.5(L5) |
| | PP 3.5 | | 93Ω | 4/4.5/4(L2) | 4/6/4(L2/L5) | 4/6/4(L2/L5) | 4/4.5/4(L5) |
| L6 Bottom | 1.7 | | 90Ω | 4/4/4(L2) | 4/5/4(L2/L5) | 4/5/4(L2/L5) | 4/4/4(L5) |
| | | | remark: ※1:"Ref Plane" means the reference plane of the traces. | | | | |

FIG. 4

| stack up code | material cost factor | finished board thickness | trace layer | core arrangement | HDI mode |
|---|---|---|---|---|---|
| H6-0.55-1a | 1.5 | 21.4 | L1/L3/L4/L6 | L3&L4: 4 H/H | 1+4+1 or 1+4+1+ |
| H6-0.6-1 | 1.5 | 21.4 | L1/L3/L4/L6 | L3&L4: 4 H/H | 1+4+1 or 1+4+1+ |
| H6-0.8-1d | 1.55 | 29.2 | L1/L2/L5/L6 | L3&L4: 8 1/1 | 1+4+1 |
| H6-1.0-1b | 1.84 | 39.2 | L1/L2/L5 | L3&L4: 18 1/1 | 1+4+1 |
| H6-1.0-2k | 1.84 | 38.6 | L1/L2/L3/L4/L5/L6 | L3&L4: 18 H/H | 1+4+1 |
| H6-1.0-4 | 1.84 | 39.2 | L1/L2/L4/L5/L6 | L3&L4: 18 1/1 | 1+4+1 |
| H6-1.0-5 | 1.84 | 39.2 | L1/L2/L3/L5/L6 | L3&L4: 18 1/1 | 1+4+1 |

HDI-6-Layer / NON-HDI-6-Layer

FIG. 5

CIRCUIT LAYOUT METHOD AND CIRCUIT LAYOUT APPARATUS

This application claims the benefit of People's Republic of China application Serial No. 201410134573.3, filed Apr. 3, 2014, the subject matter of which is incorporated herein by reference.

BACKGROUND OF THE DISCLOSURE

1. Field of the Disclosure

The disclosure relates in general to a layout, and more particularly to a circuit layout method and a circuit layout apparatus.

2. Description of the Related Art

With the development of the electronic information industry, the requirement on the signal frequency design is getting higher and higher, and the requirement on the signal quality is getting more and more stringent. In order to ensure the signal integrity, impedance matching control has become the design key for various high-quality and high-speed logic electronic circuit products. In the phase of designing the circuit board, the stack up design is the first stage of research and development work. When the research and development engineer is performing the stack up and the impedance design, the practicability evaluation of the circuit layout is often neglected due to the different experiences. Alternatively, the throughput of the circuit board factory is harder to be matched, and the effective control of the material cost is harder to be achieved. However, even if a certain circuit board factory is requested to provide a stack up program, the program cannot comply with various actual production requirements of the circuit board factories because the manufacturing capabilities and the experience data of the circuit board factories are not unified. Such the working mode causes the fragmented designs and the repeated modifications, so that the efficiency is low and the cost is higher.

SUMMARY OF THE DISCLOSURE

The disclosure is directed to a circuit layout method and a circuit layout apparatus, in which a stack up data table complying with a user request can be rapidly found according to a stack up database, so that the circuit board design cycle is shortened and the manufacturing cost is decreased.

According to a first aspect of the disclosure, a circuit layout method is provided. The circuit layout method comprises the steps of: showing a system interface; inputting a user request in response to the system interface; selecting a stack up data table, corresponding to the user request, from a stack up database; generating a design rule of a computer aided design (CAD) according to the stack up data table; and checking whether a circuit board design complies with the design rule.

According to a second aspect of the disclosure, a circuit layout apparatus is provided. The circuit layout apparatus comprises a display apparatus, an input device, a stack up database and a processor. The display apparatus shows a system interface. The input device inputs a user request in response to the system interface. The processor selects a stack up data table, corresponding to the user request, from the stack up database, and generates a design rule of a computer aided design (CAD) according to the stack up data table. The processor checks whether a circuit board design complies with the design rule.

The above and other aspects of the disclosure will become better understood with regard to the following detailed description of the preferred but non-limiting embodiment(s). The following description is made with reference to the accompanying drawings.

BRIEF DESCRIPTION OF THE DRAWINGS

FIG. 3 is a schematic view showing a system interface.
FIG. 4 is a schematic view showing a stack up data table.
FIG. 5 is a schematic view showing a stack up message summary table.

DETAILED DESCRIPTION OF THE DISCLOSURE

Figure 1:
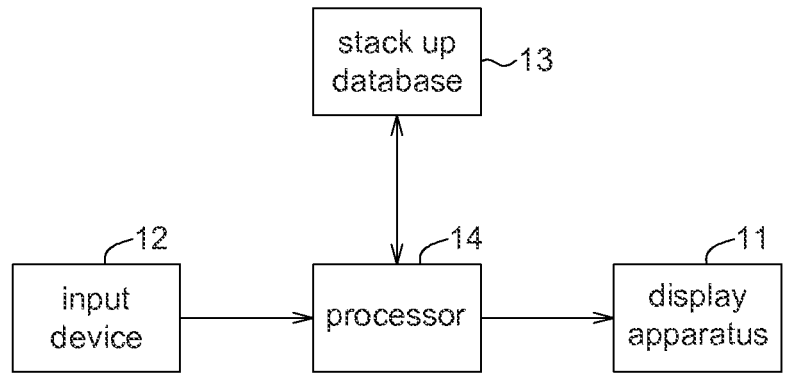
FIG. 1 is a block diagram showing a circuit layout apparatus according to an embodiment.
Figure 2:
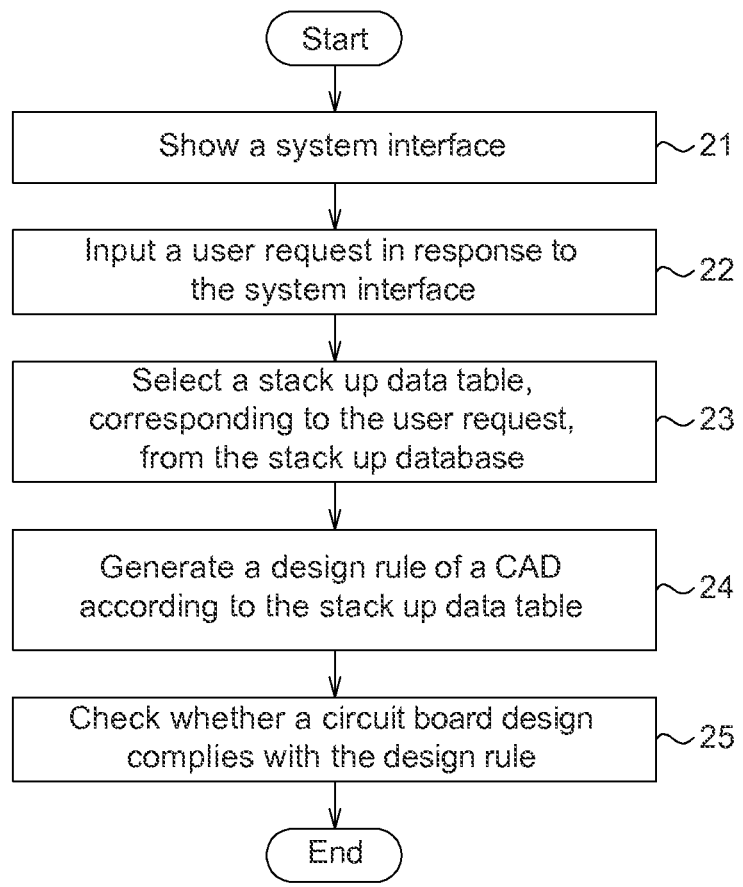
FIG. 2 is a flow chart showing a circuit layout method according to the embodiment.

FIG. 1 is a block diagram showing a circuit layout apparatus 1 according to an embodiment. FIG. 2 is a flow chart showing a circuit layout method according to the embodiment. Referring to FIGS. 1 and 2, the circuit layout apparatus 1 comprises a display apparatus 11, an input device 12, a stack up database 13 and a processor 14. The circuit layout method is applicable to the circuit layout apparatus 1 and comprises the following steps. First, as shown in step 21, the display apparatus 11 shows a system interface. Next, as shown in step 22, the input device 12 inputs a user request in response to the system interface. Then, as shown in step 23, the processor 14 selects a stack up data table, corresponding to the user request, from the stack up database 13. Next, as shown in step 24, the processor 14 generates a design rule of a computer aided design (CAD) according to the stack up data table. Then, as shown in step 25, the processor 14 checks whether the circuit board design complies with the design rule.

FIG. 3 is a schematic view showing a system interface 3. Referring to FIGS. 1 and 3, the system interface 3 comprises a basic parameter field 31, a layer type setting field 32, a suggested stack up field 33 and a preview field 34. The basic parameter field 31 and the layer type setting field 32 are for setting the user request. The basic parameter field 31 comprises a high density interconnect (HDI) option, a non-HDI option, a coplanar option, a finished board thickness, a layer count, an impedance value and a HDI mode. The layer type setting field 32 comprises a definition of each layer, a copper foil thickness definition, a reference layer definition and a dielectric layer thickness setting.

The suggested stack up field 33 shows a stack up code corresponding to the stack up data table, and the preview field 34 is for previewing the stack up data table. For example, the processor 14 preliminarily screens several stack up data tables, and stack up codes corresponding to the screened stack up data table are 6-1.0-1n, 6-1.0-2a and 6-1.0-3b, respectively. The stack up codes 6-1.0-1n, 6-1.0-2a and 6-1.0-3b may be arranged according to the material cost factor. The suggested stack up field 33 shows the stack up codes 6-1.0-1n, 6-1.0-2a and 6-1.0-3b corresponding to the stack up data table. When the user clicks the stack up code 6-1.0-2a, the preview field 34 shows the corresponding stack up data table 4.

FIG. 4 is a schematic view showing a stack up data table. FIG. 5 is a schematic view showing a stack up message summary table. Furthermore, referring to FIGS. 1, 4 and 5, the processor 14 firstly screens the corresponding stack up message from the stack up message summary table 4 according to the user request, and then screens the stack up data table from the stack up database 13 according to the stack up message. The stack up message of the stack up message summary table 4 comprises a stack up code, a material cost factor, a finished board thickness, a trace layer, a core arrangement and a high density interconnect (HDI) mode. The processor 14 can firstly perform the preliminary screen according to the manufacturing process (e.g., the HDI manufacturing process or non-HDI manufacturing process) and the layer count of the circuit board, and then perform the further screen to find the corresponding stack up data table 4 further according to the trace layer and the HDI mode.

The stack up data table 4 comprises a header 41, a stack up field 42, an impedance requirement field 43 and a remark field 44. The header 41 comprises a stack up code, a material cost factor, a finished board thickness and a precaution. The stack up code is for indicating a manufacturing process, a layer count, a finished board thickness and a stack up data table version of the stack up design. For example, if the stack up code is H10-1.0-5j, then "H" represents that the circuit board is made by the HDI manufacturing process, "10" represents that the circuit board is a 10-layer board, "1.0" represents the finished board thickness (mm) of the circuit board, "5" represents the serial number, "j" represents the version of the serial number, and "(2.82)" represents the material cost factor of the stack up design.

If the stack up code is 10-1.0-5j, then it represents that the circuit board is made by the non-HDI manufacturing process, and the other codes have the meanings the same as those described hereinabove. If the circuit board needs not the impedance control, then "NC" may be added to the end of the stack up code for the purpose of differentiation. If the circuit board comprises other special treatments, then "S" may be added to the end of the stack up code for the purpose of differentiation. The stack up field 42 comprises a stack up design. The impedance requirement field 43 comprises line width data corresponding to the stack up design. Alternatively, the impedance requirement field 43 comprises line width data and line spacing data corresponding to the stack up design. The remark field 44 comprises remark data corresponding to the stack up design. The remark data is, for example, associated precautions upon using the stack up design.

Figure 6:
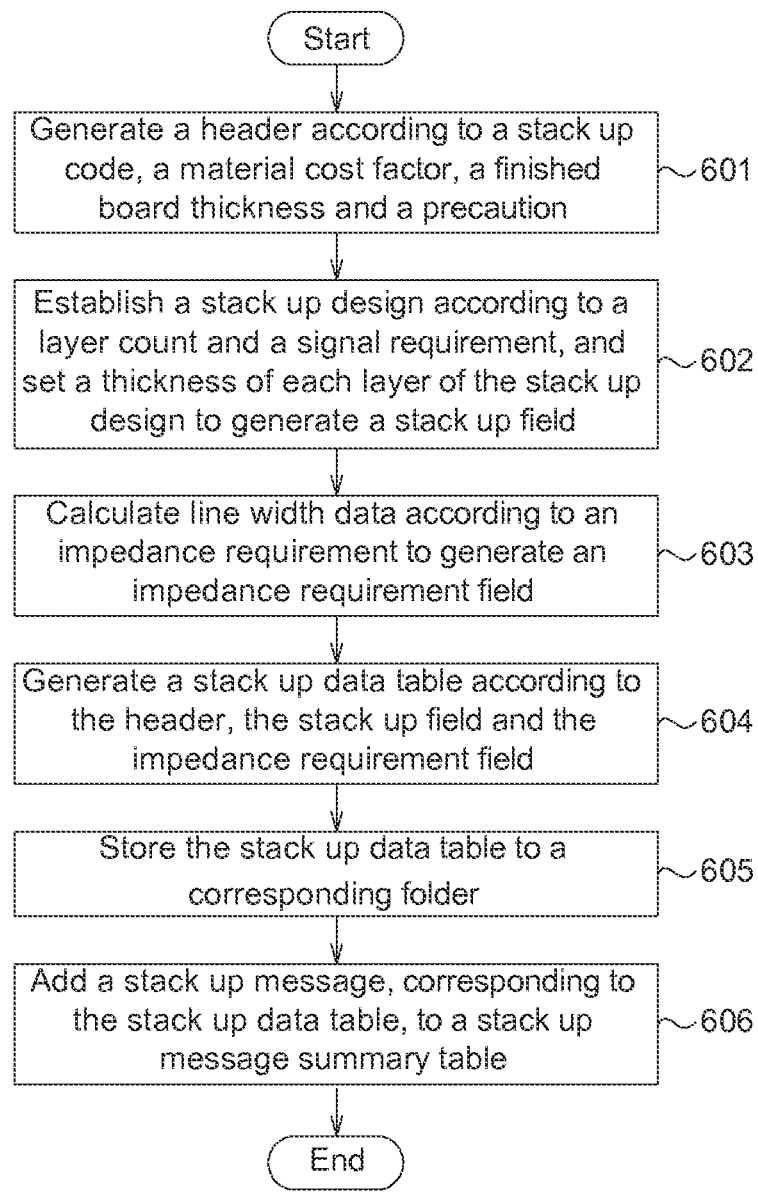
FIG. 6 is a flow chart showing a database establishing procedure.

FIG. 6 is a flow chart showing a database establishing procedure. Referring to FIGS. 1, 4, 5 and 6, the stack up database 13 is generated through the database establishing procedure, which comprises the following steps. First, as shown in step 601, the processor 14 generates the header according to the stack up code, the material cost factor, the finished board thickness and the precaution. Next, as shown in step 602, the processor 14 establishes the stack up design according to the layer count and the signal requirement, and sets the thickness of each layer of the stack up design to generate the stack up field. Then, as shown in step 603, the processor 14 calculates the line width data according to the impedance requirement to generate the impedance requirement field. Alternatively, the processor 14 calculates the line width data and line spacing data according to the impedance requirement to generate the impedance requirement field. Then, as shown in step 604, the processor 14 generates the stack up data table 4 according to the header, the stack up field and the impedance requirement field. Next, as shown in step 605, the processor 14 stores the stack up data table 4 to a corresponding folder. Then, as shown in step 606, the processor 14 adds a stack up message, corresponding to the stack up data table 4, to a stack up message summary table 5.

Figure 7:
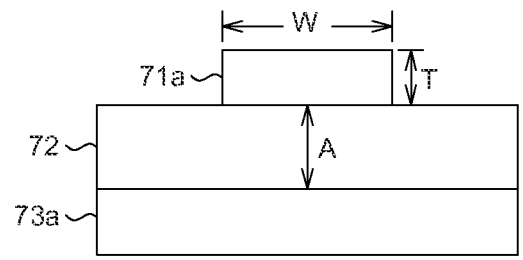
FIG. 7 is a schematic view showing a first circuit design.

FIG. 7 is a schematic view showing a first circuit design. As shown in FIG. 7, a signal line 71a is formed on a reference layer 73a, and a prepreg (P.P) 72 is interposed between the signal line 71a and the reference layer 73a. The reference layer 73a is, for example, a power layer or a grounding layer. A microstrip line impedance Zo may be obtained by the following formula:

$$Zo = \frac{87}{\sqrt{\varepsilon_r + 1.41}} \operatorname{Ln}\left(\frac{5.98 \times A}{0.8\ W + T}\right),$$

where $\varepsilon_r$ is a dielectric constant of the prepreg 72; W is a line width of the signal line 71a; T is the thickness of the signal line; and A is the distance from the signal line 71a to the reference layer 73a. According to the above-mentioned formula, the line widths corresponding to different impedance requirements in the stack up data table 4 can be calculated.

Figure 8:
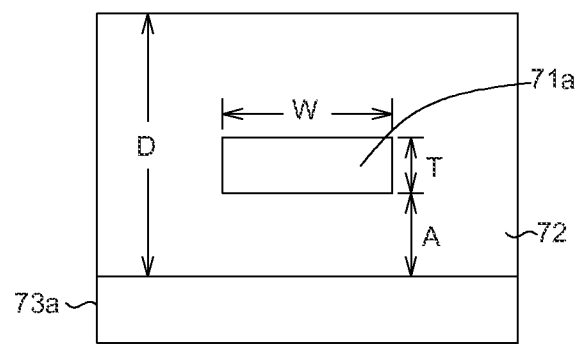
FIG. 8 is a schematic view showing a second circuit design.

FIG. 8 is a schematic view showing a second circuit design. As shown in FIG. 8, the signal line 71a is formed in the prepreg 72, and the prepreg 72 is formed on the reference layer 73a. The microstrip line impedance Zo may be obtained by the following formulas:

$$Zo = \frac{87}{\sqrt{\varepsilon_r' + 1.41}} \operatorname{Ln}\left(\frac{5.98 \times A}{0.8\ W + T}\right),$$

and $\varepsilon_r' = \varepsilon_r[1 - \exp(-1.55 D/A)]$, where $\varepsilon_r$ is the dielectric constant of the prepreg 72; W is the line width of the signal line 71a; T is the thickness of the signal line; A is the distance from the signal line 71a to the reference layer 73a; and D is the thickness of the prepreg 72. According to the above-mentioned formulas, the line widths corresponding to different impedance requirements in the stack up data table 4 can be calculated.

Figure 9:
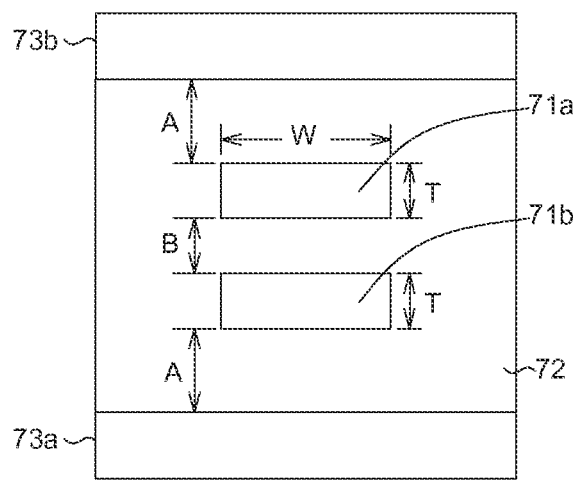
FIG. 9 is a schematic view showing a third circuit design.

FIG. 9 is a schematic view showing a third circuit design. As shown in FIG. 9, the signal line 71a and a signal line 71b are formed in the prepreg 72, and the prepreg 72 is formed between the reference layer 73a and a reference layer 73b. The microstrip line impedance Zo may be obtained by the following formula:

$$Zo = \frac{87}{\sqrt{\varepsilon_r}} \operatorname{Ln}\left[\left(\frac{1.9 \times (2A + T)}{0.8\ W + T}\right)\right] \times \left[1 - \frac{A}{4(A + B + T)}\right],$$

where $\varepsilon_r$ is the dielectric constant of the prepreg 72; W is the line width of the signal line 71a or the signal line 71b; T is the thickness of the signal line; A is the distance from the signal line 71a to the reference layer 73b or the distance from the signal line 71b to the reference layer 73a; and B is the distance from the signal line 71a to the signal line 71b. According to the above-mentioned formula, the line widths corresponding to different impedance requirements in the stack up data table 4 can be calculated.

Figure 10:
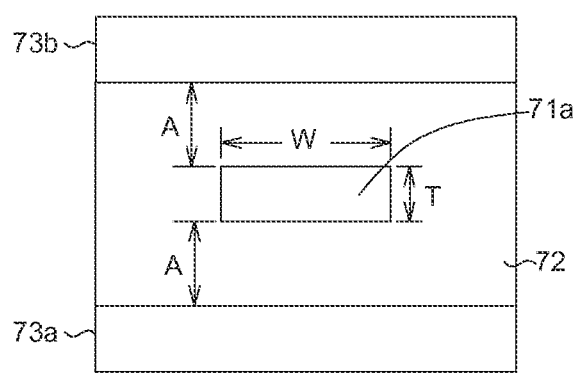
FIG. 10 is a schematic view showing a fourth circuit design.

FIG. 10 is a schematic view showing a fourth circuit design. As shown in FIG. 10, the signal line 71a is formed in the prepreg 72, and the prepreg 72 is formed between the reference layer 73*a* and the reference layer 73*b*. The microstrip line impedance Zo may be obtained by the following formula:

$$Zo = \frac{60}{\sqrt{\varepsilon_r}} \text{Ln}\left[\left(\frac{4D}{0.67\pi(0.8\ W + T)}\right)\right],$$

where $\in_r$ is the dielectric constant of the prepreg 72; W is the line width of the signal line 71*a*; T is the thickness of the signal line; A is the distance from the signal line 71*a* to the reference layer 73*b* or the distance from the signal line 71*a* to the reference layer 73*a*. According to the above-mentioned formula, the line widths corresponding to different impedance requirements in the stack up data table 4 can be calculated.

The circuit layout method and the circuit layout apparatus according to each embodiment can rapidly provide the stack up data table and its corresponding design rule for the user. Consequently, it is helpful to the elimination of the manpower and time of the middle and end calculations, so that the manpower and time cost are saved, and the competition ability of the product is further enhanced.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit layout method, comprises:
   displaying a system interface by a display apparatus;
   receiving a user request in response to an input from an input device;
   selecting a stack up data table, corresponding to the user request, from a stack up database by a processor, wherein the stack up data table comprises a header, a stack up field and an impedance requirement field, the stack up field comprises a stack up design, and the impedance requirement field comprises a line width data corresponding to the stack up design;
   generating a design rule of a computer aided design (CAD) according to the stack up data table by the processor, wherein the design rule comprises the stack up design and the line width data; and
   comparing a circuit board design with the design rule to determine whether the circuit board design complies with the design rule by the processor.

2. The circuit layout method according to claim 1, wherein the step of selecting comprises:
   screening a corresponding stack up message from a stack up message summary table according to the user request; and
   screening the stack up data table from the stack up database according to the stack up message.

3. The circuit layout method according to claim 2, wherein the system interface comprises a basic parameter field, a layer type setting field, a suggested stack up field and a preview field, the basic parameter field and the layer type setting field are for setting the user request, the suggested stack up field shows a stack up code corresponding to the stack up data table, and the preview field is for previewing the stack up data table.

4. The circuit layout method according to claim 3, wherein the basic parameter field comprises a high density interconnect (HDI) option, a non-HDI option, a coplanar option, a finished board thickness, a layer count, an impedance value and a HDI mode.

5. The circuit layout method according to claim 3, wherein the layer type setting field comprises a definition of each layer, a copper foil thickness definition, a reference layer definition and a dielectric layer thickness setting.

6. The circuit layout method according to claim 1, wherein the header comprises a stack up code and a material cost factor, and the stack up code is for indicating a manufacturing process, a layer count, a finished board thickness and a version of the stack up data table of the stack up design.

7. The circuit layout method according to claim 6, wherein the stack up database is generated through a database establishing procedure, which comprises:
   generating the header according to the stack up code and the material cost factor;
   establishing the stack up design according to the layer count and a signal requirement, and setting a thickness of each layer of the stack up design to generate the stack up field;
   calculating the line width data according to an impedance requirement to generate the impedance requirement field;
   generating the stack up data table according to the header, the stack up field and the impedance requirement field;
   storing the stack up data table to a corresponding folder; and
   adding a stack up message, corresponding to the stack up data table, to a stack up message summary table.

8. A circuit layout apparatus, comprising:
   a display apparatus for showing a system interface;
   an input device for inputting a user request in response to the system interface;
   a stack up database; and
   a processor for selecting a stack up data table, corresponding to the user request, from the stack up database, and generating a design rule of a computer aided design (CAD) according to the stack up data table, wherein the stack up data table comprises a header, a stack up field and an impedance requirement field, the stack up field comprises a stack up design, and the impedance requirement field comprises the stack up design corresponding a line width data, the design rule comprises the stack up design and the line width data, and the processor compares a circuit board design with the design rule to check whether the circuit board design complies with the design rule.

9. The circuit layout apparatus according to claim 8, wherein the processor
   screening a corresponding stack up message from a stack up message summary table according to the user request, and screening the stack up data table from the stack up database according to the stack up message.

10. The circuit layout apparatus according to claim 9, wherein the system interface comprises a basic parameter field, a layer type setting field, a suggested stack up field and a preview field, the basic parameter field and the layer type setting field are for setting the user request, the suggested stack up field shows a stack up code corresponding to the stack up data table, and the preview field is for previewing the stack up data table.

11. The circuit layout apparatus according to claim 10, wherein the basic parameter field comprises a high density interconnect (HDI) option, a non-HDI option, a coplanar option, a finished board thickness, a layer count, an impedance value and a HDI mode.

12. The circuit layout apparatus according to claim 10, wherein the layer type setting field comprises a definition of each layer, a copper foil thickness definition, a reference layer definition and a dielectric layer thickness setting.

13. The circuit layout apparatus according to claim 8, wherein the header comprises a stack up code and a material cost factor, and the stack up code is for indicating a manufacturing process, a layer count, a finished board thickness and a version of the stack up data table of the stack up design.

14. The circuit layout apparatus according to claim 13, wherein:
 the stack up database is generated by the processor executing a database establishing procedure;
 when the processor executes the database establishing procedure, the processor establishes the stack up design according to the stack up code and the material cost factor and according to the layer count and a signal requirement, and sets a thickness of each layer of the stack up design to generate the stack up field; and
 when the processor executes the database establishing procedure, the processor calculates the line width data according to an impedance requirement to generate the impedance requirement field;
 when the processor executes the database establishing procedure, the processor generates the stack up data table according to the header, the stack up field, the impedance requirement field and a remark field, and stores the stack up data table to a corresponding folder; and
 when the processor executes the database establishing procedure, the processor adds a stack up message, corresponding to the stack up data table, to a stack up message summary table.

* * * * *